United States Patent [19]
Pedersen

[11] Patent Number: 5,649,150
[45] Date of Patent: Jul. 15, 1997

[54] SCANNABLE LAST-IN-FIRST-OUT REGISTER STACK

[75] Inventor: Mark Eric Pedersen, Burlington, Vt.

[73] Assignee: International Business Machines Corporation, Armonk, N.Y.

[21] Appl. No.: 420,962

[22] Filed: Apr. 12, 1995

[51] Int. Cl.$^6$ .............................. G06F 13/00; G06F 11/00
[52] U.S. Cl. .................... 395/437; 395/436; 395/183.06; 371/22.3
[58] Field of Search ...................... 395/436, 437, 395/183.06; 371/22.3; 365/78, 80, 73, 81; 377/67

[56] References Cited

U.S. PATENT DOCUMENTS

| | | | |
|---|---|---|---|
| 3,971,920 | 7/1976 | Johnson | 377/67 |
| 3,972,034 | 7/1976 | Derickson, III et al. | 365/219 |
| 4,305,138 | 12/1981 | Dakovski et al. | 365/73 |
| 5,396,236 | 3/1995 | Ueda | 341/50 |

FOREIGN PATENT DOCUMENTS

0645775A1 9/1994 European Pat. Off. .
2674666 3/1992 France .

*Primary Examiner*—Eddie P. Chan
*Assistant Examiner*—Kevin L. Ellis
*Attorney, Agent, or Firm*—Eugene Shkurko; Duke W. Yee; Andrew J. Dillon

[57] ABSTRACT

A scannable LIFO register stack in which registers are arranged in a stack with each register having a number of bit locations. Each register is in communication with an adjacent register located above and below it. In particular, each bit location in a register within the stack located between the top and the bottom register is in communication with a corresponding bit location in an adjacent register located above the register and a corresponding bit location in an adjacent register located below the register. Except for the last bit, each bit location in the top register has a connection to an offset bit location in the bottom register. Shifting a bit of data from a bit location in the top register to the offset bit location in the bottom register results in the bit being shifted to the right by one bit location according to the present invention. The last bit location in the top register has an output that is used as a scan output. The first bit location in the bottom register has an input used as a scan input.

10 Claims, 8 Drawing Sheets assumes n-bit, m registers deep lifo stack <row, column> 200

| operation | control signals | clock behavior | action |
|---|---|---|---|
| idle | wr = rd = scan_ctl = 0 | mckw = 0<br>mckr = 0<br>sck = 1 | no action |
| write | wr = 1<br>(rd = 0 &<br>scan_ctl = 0) | mckw = $\overline{sysclk}$<br>mckr = 0<br>sck = sysclk | REG$_0$ ← DATA IN<br>REG$_i$ ← REG$_{i-1}$<br>DATA OUT = REG$_0$ |
| read | rd = 1<br>(wr = 0 &<br>scan_ctl = 0) | mckw = 0<br>mckr = $\overline{sysclk}$<br>sck = sysclk | REG$_i$ ← REG$_{i+1}$<br>REG<m,0> ← SCANIN<br>REG<m,i> ← REG<0,i-1>; 0 ≤ i ≤ n<br>DATA OUT = REG$_0$ |
| scan | wr = rd = X<br>scan_ctl = 1 | mckw = 0<br>mckr = $\overline{sysclk}$<br>sck = sysclk | REG<m,0> ← SCANIN<br>REG<m,i> ← REG<0,i-1>; 0 ≤ i ≤ n<br>REG<i,j> ← REG<i+1,j>; 0 ≤ i ≤ m-1<br>0 ≤ i ≤ n<br>SCANOUT ← REG<0,n> |

Fig. 11

SCANNABLE LAST-IN-FIRST-OUT REGISTER STACK

BACKGROUND OF THE INVENTION

1. Technical Field

The present invention relates generally to computer systems and in particular to microprocessor architecture. Still more particularly, the present invention provides an improved scannable last-in-first-out (LIFO) register stack.

2. Description of the Related Art

In a computer system, a microprocessor is a single-chip integrated circuit implementation of a general-purpose central processing unit. A microprocessor contains a controller to direct execution of programs, registers to store, control, and data value temporally, and in an arithmetic logic unit to calculate results. A LIFO register stack may be found in microprocessor and other logic designs. In particular, a LIFO register stack is a type of memory element that stores and retrieves information. In this type of memory element, the item stored last is the first item retrieved. LIFO register stacks are commonly found in microprocessors because of their ability to handle recursive operations and the simplicity of addressing these memory elements.

A LIFO register stack may be implemented in a variety of ways known to those of ordinary skill in the art. One implementation is shown in FIG. 1. LIFO register stack 100 in FIG. 1 contains several registers R0–Rm arranged in a stack. Each register contains n bits in n bit locations. The write path is from the direction R0 to Rm while the read path is in the direction Rm toward R0.

The registers are typically arranged in a stack in which each register includes an array of bit locations. m registers and n bit locations are arranged so that the input to a register comes from either the register above or the register below. The read ports in the bit locations in the bottom register are typically unused in this type of configuration. The input to the top register A0 comes either from the data in pod of the stack or the register below. Input to the bottom register, register Am, comes only from the register above it.

Concerning FIG. 2, a logic diagram of circuitry for a bit location in a register in LIFO register stack 100 is depicted. In this depicted example, the circuitry is for bit location j in register i. The circuitry contains a multiplexer 110 and a latch 112. In the depicted example, latch 112 is a master/slave latch. Multiplexer 110 has a write input w and a read input r. Additionally, a hold input is present in multiplexer 110. Multiplexer 110 also includes enable inputs 114 and 116. Enable input 114 allows the signal at write input w to be sent to input d in latch 112 while an enable signal at input 116 allows the signal connected to read input r to be sent to input d.

For bit location j in register i, write input w is connected to bit location j in register i−1 and read input r is connected to bit location j in register i+1. Latch 112 has an output q connected to bit location j of register i−1 and bit location j of register i+1. Master clock signal mck and slave clock signal sck are employed to clock data through latch 112.

Generally, two operations control the function of LIFO stack register 100 in FIG. 1. A write to the stack (also called a "push") adds another item to the top of the stack. Items already in the stack are shifted down so that the item stored in register i moves to register i+1. Any item stored in the register at the bottom of the stack "falls off" the bottom of the stack and is lost in a write operation.

A read of the stack (also called a "pop") removes the item located in the top of the stack. In response to the top item being removed, other items in the stack are shifted upward such that the item stored in register i moves into register i−1. The contents of the register at the bottom of the stack are undefined after a read operation. As a result, if the number of "pops" ever exceeds the number of "pushes" the data taken from the stack will be invalid then. Monitoring logic is typically employed to ensure that such invalid data is ignored.

The sequential nature of access to lower regions of the stack typically takes i+1 writes followed by i+1 reads to exercise and observe the contents of register i. This type of access makes the stack very difficult to test without special provisions. Often employing scan techniques to provide complete test coverage of the stacks is important.

In scanning a stack, selected data is written into every bit location in every register of the stack to "set" the state of the stack. After the contents of a stack has been set by a scan, the LIFO register stack may then be tested. One way to add scan to a LIFO register task is to apply standard scan techniques to the registers in the stack. Such a technique requires adding a scan input to every latch employed in the LIFO register stack and a corresponding scan clock controlling the scan operation of the stack. FIG. 3 depicts a LIFO register stack 130. This register stack is similar to the one depicted in FIG. 1 except that a scan input 132 has been added to the stack and a scan output 134 has been added. In such a scan path, data is scanned from bit location to bit location within each register with the last bit location at an end of one register feeding to the first bit location of the succeeding register as depicted in FIG. 3.

FIG. 4 shows a logic diagram for a bit location in a register in FIG. 2. Multiplexer 140 is configured in the same manner as multiplexer 110 in FIG. 2. Latch 142 is similar to latch 112 except that an additional input sd has been included for scan data and an additional input for scan clock scnck has been added. Output q of latch 142 also is connected to bit location j+1 in register i to allow shifting of data across the register when data is scanned through the LIFO register stack.

As can be seen, the additional input into latch 142 requires extra devices and logic circuits to handle the input during a scan. Other scan techniques presently known may require extra clocking in addition to extra devices and logic circuits. The addition of extra circuits and clocks can degrade the overall performance of the microprocessor or logic design in which the LIFO register stack is implemented. Therefore, having an improved LIFO register stack that is scannable would be advantageous, but does not require additional devices, logic circuits, or clocking to provide a scanning capability.

SUMMARY OF THE INVENTION

It is one object of the present invention to provide to an improved computer system.

It is another object of the present invention to provide an improved microprocessor architecture.

It is yet another object of the present invention to provide an improved scannable last-in-first-out (LIFO) register stack.

The present invention provides a scannable LIFO register stack. Registers are arranged in a stack with each register having a number of bit locations. Each register is in communication with an adjacent register located above and below it in the stack. In particular, each bit location in a register within the stack located between the top and the bottom register is in communication with a corresponding bit location in an adjacent register located above the register and a corresponding bit location in an adjacent register located below the register. A corresponding bit location for a bit location in a first register is a bit location located in another register in the stack having the same position within the register as the bit location in the first register. Except for the last bit, each bit location in the top register has a connection to an offset bit location in the bottom register. Shifting a bit of data from a bit location in the top register to the offset bit location in the bottom register results in the bit being shifted to the right by one bit location (an offset bit location) according to a preferred embodiment of present invention. The last bit location in the top register has an output used as a scan output. The first bit location in the bottom register has an input used as a scan input.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 11 is a function table for a LIFO register stack having n bits and m registers;

DETAILED DESCRIPTION OF PREFERRED EMBODIMENT

Figure 5:
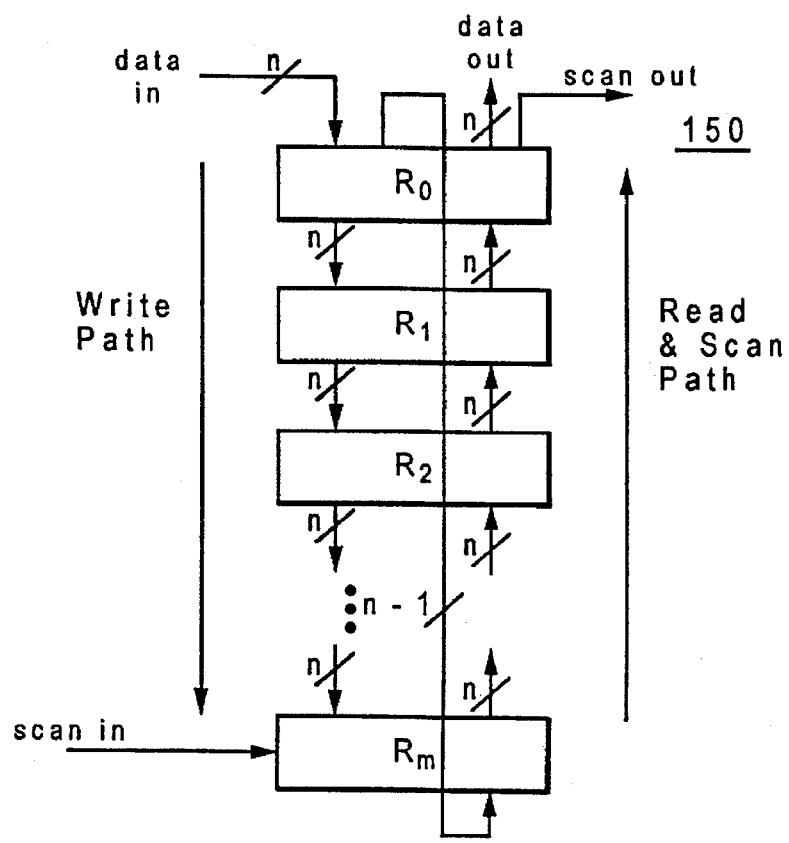
FIG. 5 is a block diagram of a scannable LIFO register stack depicted in accordance with a preferred embodiment of the present invention.

In accordance with a preferred embodiment of the present invention, the existing read path in a LIFO register stack is used to provide a new scan path. With reference to FIG. 5, a block diagram of a scannable LIFO register stack 150 is depicted in accordance with a preferred embodiment of the present invention. LIFO register stack 150 includes registers R0 through Rm arranged in a stack in which each register includes n bit locations. Each register in the LIFO register stack sends bits to and receives bits from an adjacent register located just above and below the register (e.g., register R1 sends and receives bits via registers R0 and R2). In accordance with a preferred embodiment of the present invention, the read path in LIFO register stack 150 is used during a read operation or during a scan. The output of the top register, register R0, is normally lost during a read. Under the present invention, however, this output from the bit locations in register R0 is routed to the unused read port of the bottom register, register Rm shifted by 1 bit to the right in accordance with a preferred embodiment of the present invention. The read input of the first bit location in the bottom register, register Rm, is connected to the scan input for the stack. The scan outputs come from the last bit location in the top register, register R0.

As a result, data being input into LIFO register stack 150 starts at the first bit location of register Rm and moves up through corresponding bit locations in registers located above register Rm. When a bit location in register R0 is reached, the data is routed to an "offset" bit location in register Rm. In other words, of data moved from a bit location in register R0 to an "offset" bit location in register Rm is shifted over to the right by one bit. From the bottom register, register Rm, the data is then moved upward into corresponding bit locations until the top register, register R0, is reached, then the data is moved back to the bottom register, register Rm, again shifted to the right by one bit. This path is followed until the last bit location in register R0 is reached. The output of the last bit location in register R0 provides a scan output.

Figure 1:
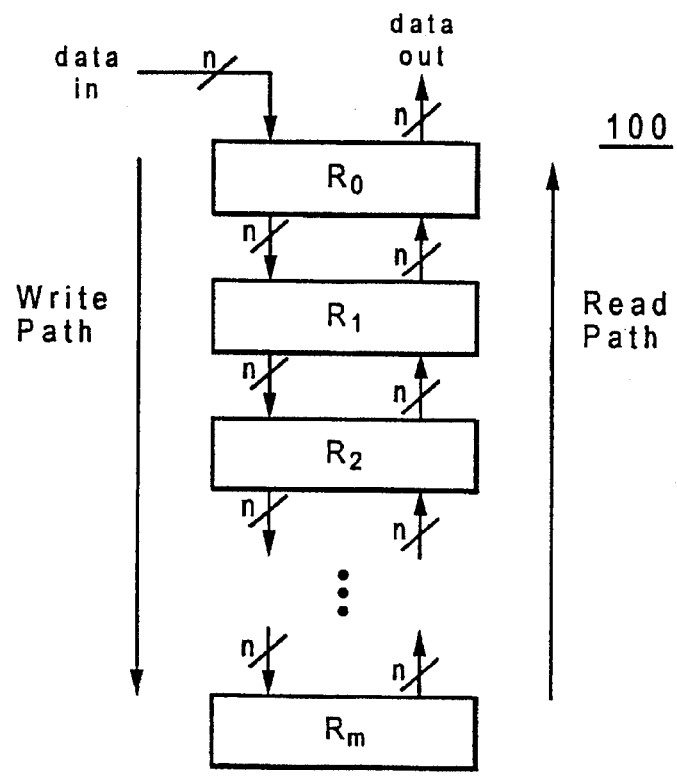
FIG. 1 is a known LIFO register stack.
Figure 2:
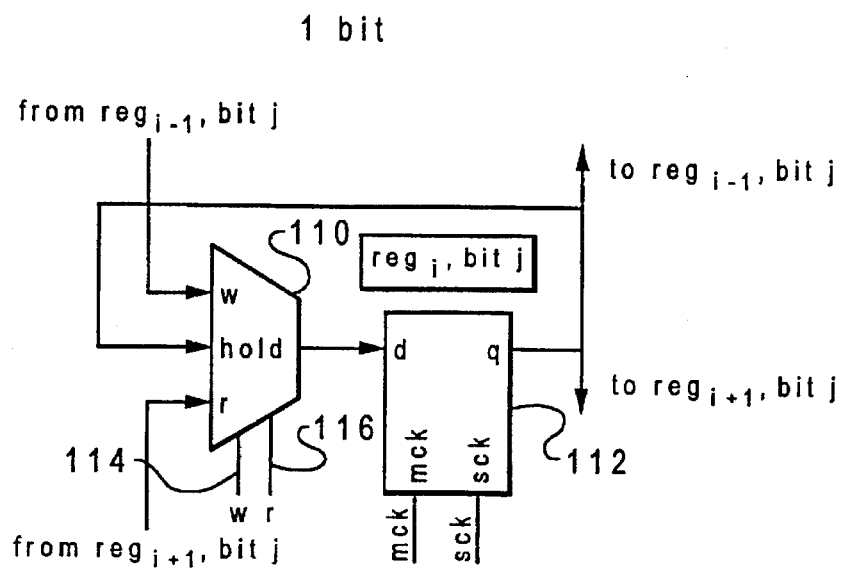
FIG. 2 is a logic diagram of circuitry for one bit location in a register in the LIFO register stack of FIG. 1.
Figure 3:
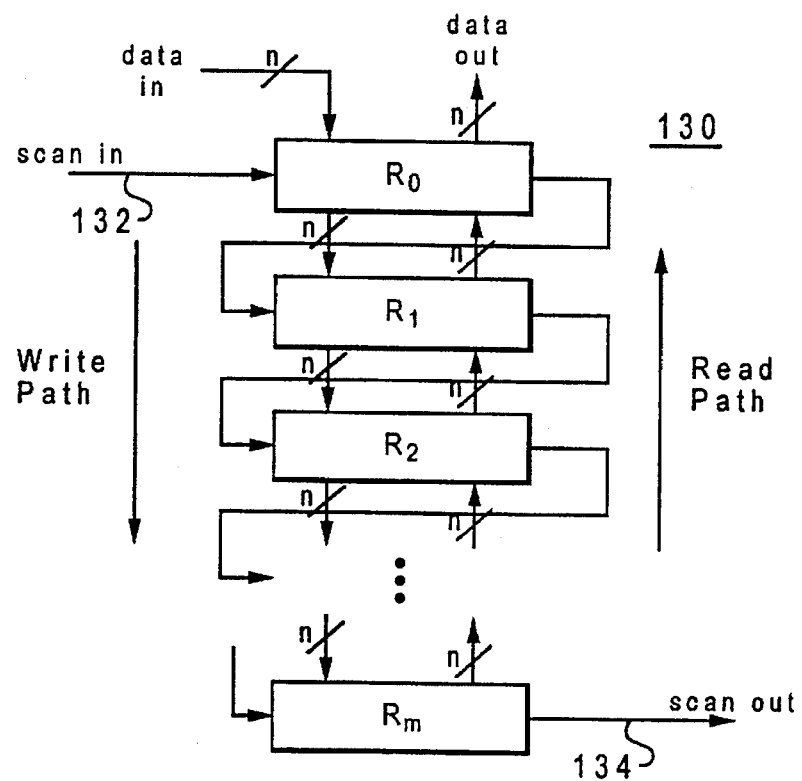
FIG. 3 is a known scannable LIFO register stack.
Figure 4:
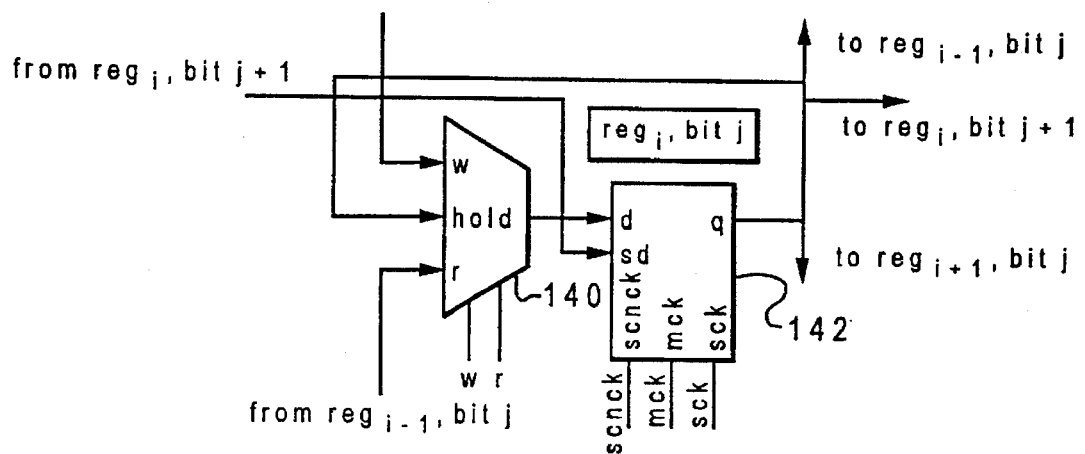
FIG. 4 is a logic diagram of circuitry used for one bit location in a register in the LIFO register stack of FIG. 3.
Figure 6:
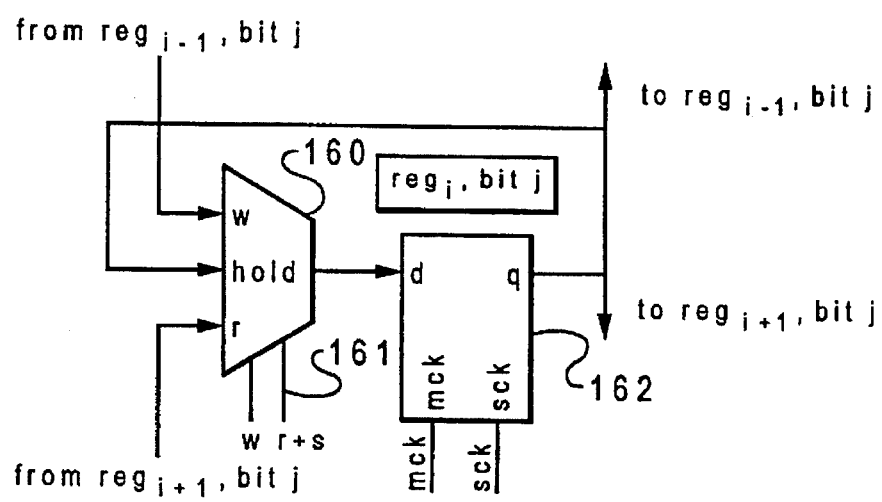
FIG. 6 is a logic diagram of bit location j in register i depicted in accordance with a preferred embodiment of the present invention.

With reference now to FIG. 6, a logic diagram of a bit location j in register i in the LIFO register stack of FIG. 5 is depicted in accordance with a preferred embodiment of the present invention. Multiplexer 160 is the same as prior art multiplexer 110 shown in FIG. 2 except that read input r also may receive data during a read and data from a scan operation in response to a signal at enable input 161. Latch 162 requires no modification from a latch such as that depicted in FIG. 2.

Figure 7:
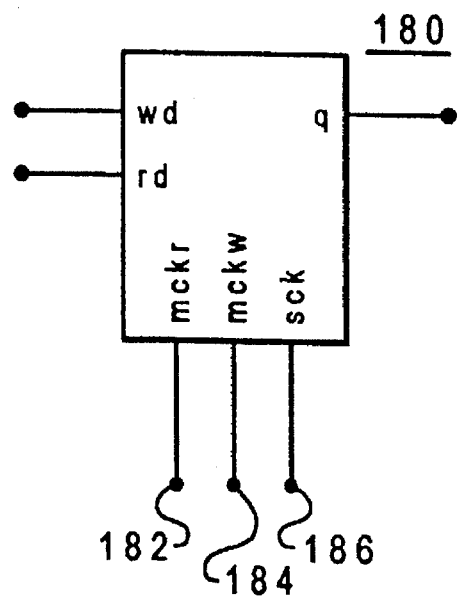
FIG. 7 is a logic diagram of a LIFO register stack utilizing qualified clocks depicted in accordance with a preferred embodiment of the present invention.

With reference now to FIG. 7, a diagram of a latch for a single bit location in a register is depicted in accordance with a preferred embodiment of the present invention, also referred to as a dual port master slave latch. As can be seen, latch 180 includes write input wd and read input rd along with output q. Latch 180 also includes an input 182 for a master write clock mckw, an input 184 for a master read clock mckr, and an input 186 for a slave clock sck.

Figure 8:
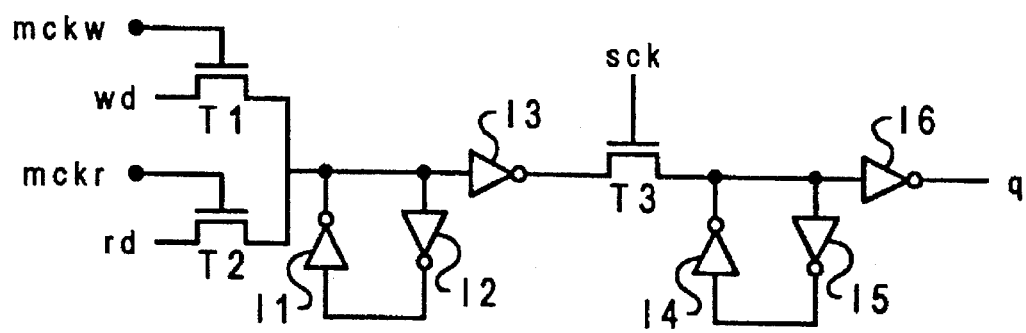
FIG. 8 is a diagram of a single bit location in a register from FIG. 7 depicted in accordance with a preferred embodiment of the present invention.

FIG. 8 illustrates a schematic diagram of latch 180 in FIG. 7. As can be seen, latch 180 includes transistors T1 through T3 and inverters I1 through I6. Transistors T1–T3 are n channel MOSFETs in accordance with a preferred embodiment of the present invention. The gate of transistor T1 is controlled by master write clock mckw. The gate of transistor T2 is controlled by master read clock mckr. Transistor T3 has a gate controlled by slave clock sck. Inputs for write and read data are located at the source/drains of transistors T1 and T2, respectively. The output to the latch is located at the output of inverter I6.

Figure 9:
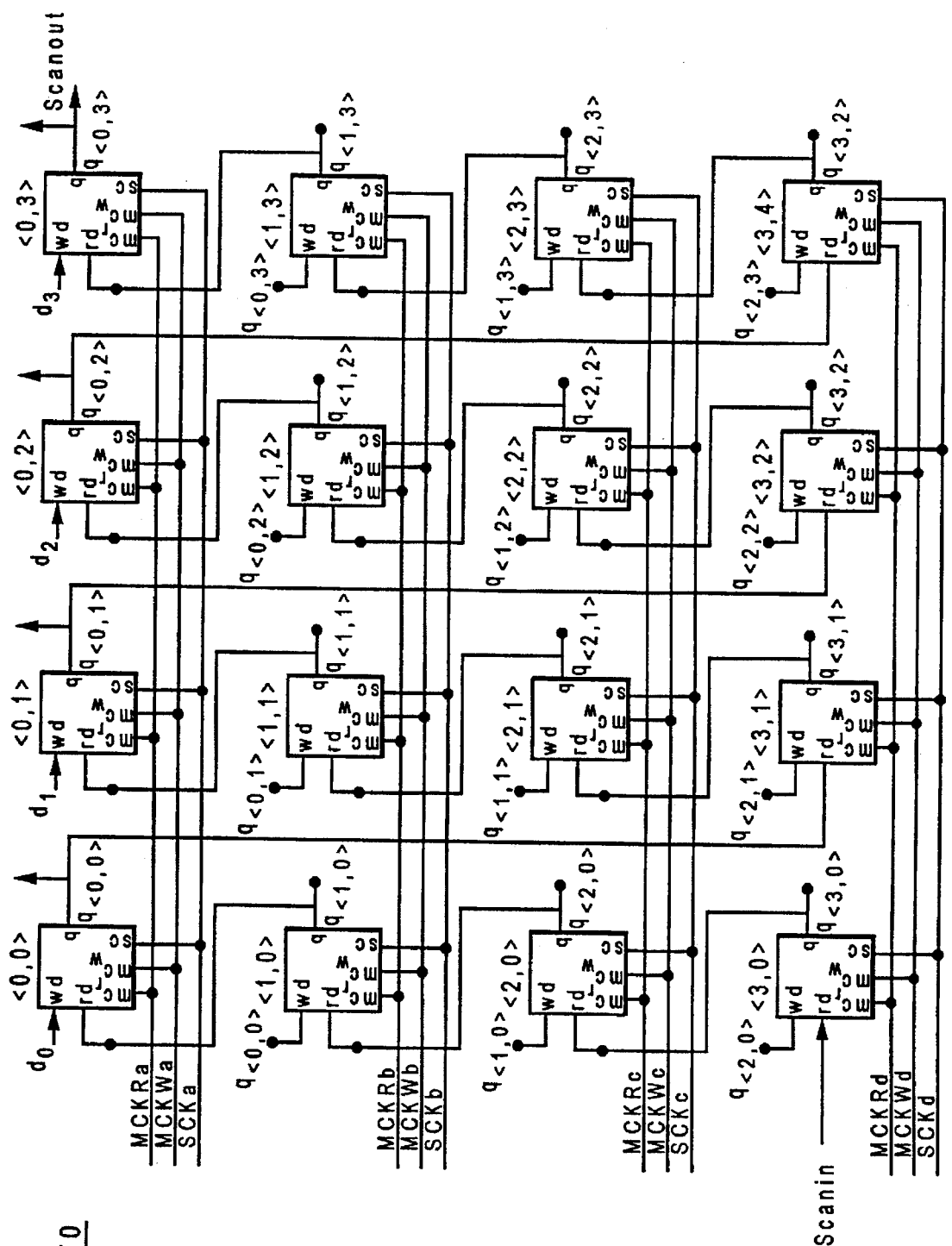
FIG. 9 is a schematic diagram of a latch for a bit location in accordance with a preferred embodiment of the present invention.

With reference now to FIG. 9, a logic diagram of a LIFO register stack utilizing qualified clocks is depicted in accordance with a preferred embodiment of the present invention. LIFO register stack 170 includes registers Ra through Rd. Each register contains four bits. Although the depicted embodiment contains four registers having four bits each (bit locations <0,0>-<0,3> in register Ra, <1,0>-<1-3> in register Rb, <2,0>-<2,3> in register Rc, and <3,0>-<3,3> in register Rd), LIFO register stacks having other numbers of registers and bits may be created utilizing the present invention. As shown in FIG. 9, the output of the top bit locations in the top register is coupled to the read inputs of the bit locations in the bottom register, and an unused input port in first bit location in the bottom register is used to add a scan capability to a LIFO register stack. Specifically, note, e.g., bit <3,0> location has a scan input at input rd and a scan output is at the output q of bit location <0,3>, which is also coupled to the rd input of bit location <3,11> of register Rd.

In general, data is scanned in at the read input rd of bit location <3,0> and is moved through corresponding bits in registers above until the top register is reached. At bit location <0,0>, the data is sent to the bottom register shifted by one bit to bit location <3,1>. This process of moving data of up bit locations through the registers and shifting by one bit continues until the last bit location, bit location <0,3>, in register Ra is reached. At that point, data is scanned out at output q for bit location <0,3> in register Ra.

Figure 10:
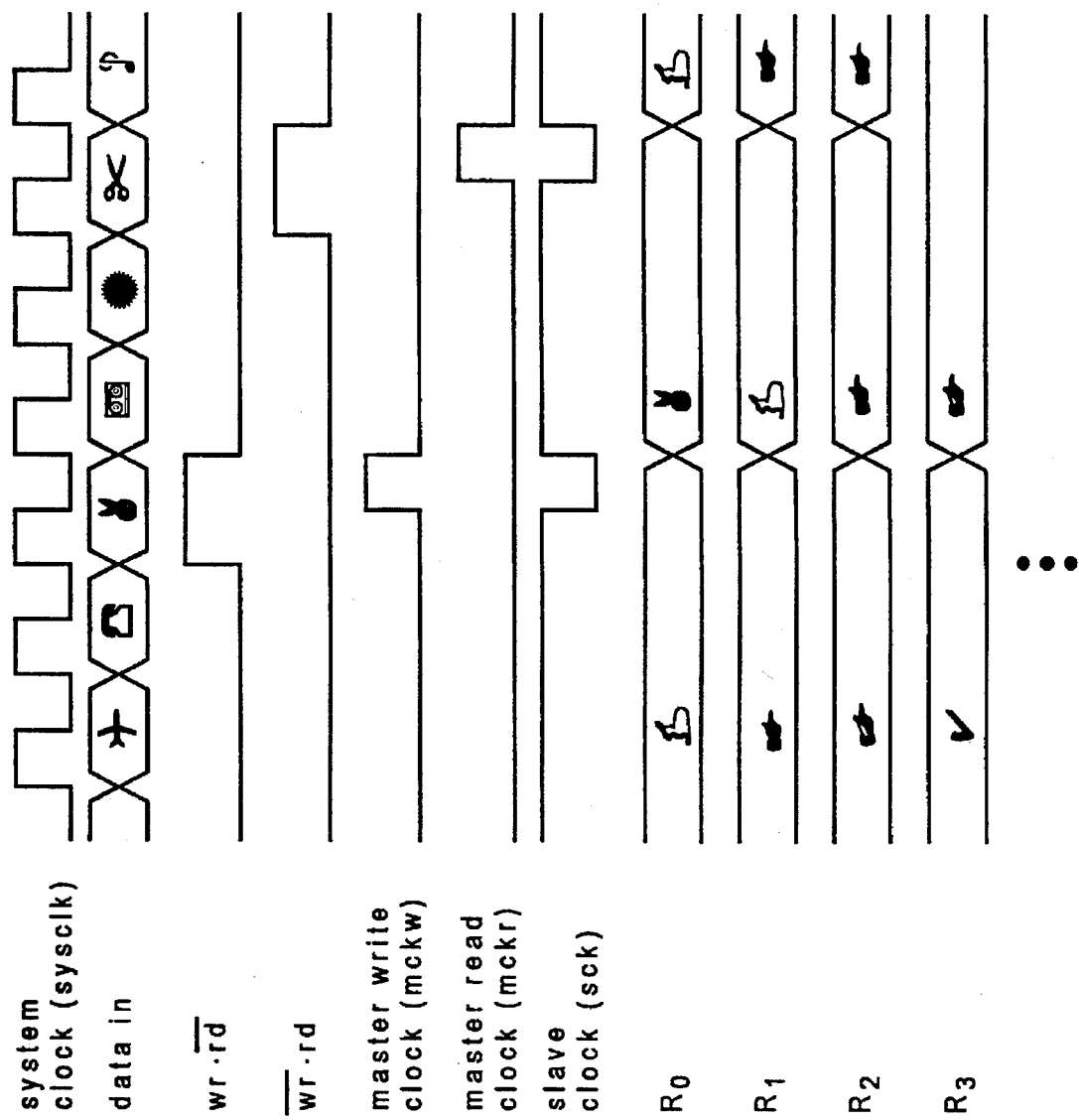
FIG. 10 is a timing diagram for a LIFO register stack depicted in accordance with a preferred embodiment of the present invention.
Figure 13:
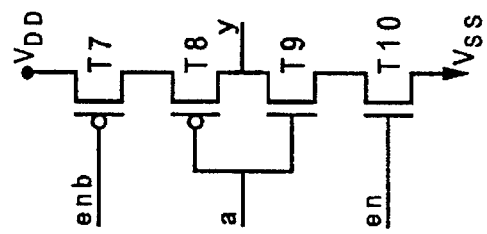
FIG. 13 is a schematic diagram of a three-state inverter in accordance with a preferred embodiment of the present invention.

With reference now to FIG. 10, a timing diagram for LIFO register stack 180 is depicted in accordance with a preferred embodiment of the present invention. FIG. 11 depicts a function table 200 for a LIFO register stack having n bits and m registers. Function table 200 depicts the various actions that occur in response to operations item, write, read, and scan in accordance with a preferred embodiment of the present invention.

Figure 12:
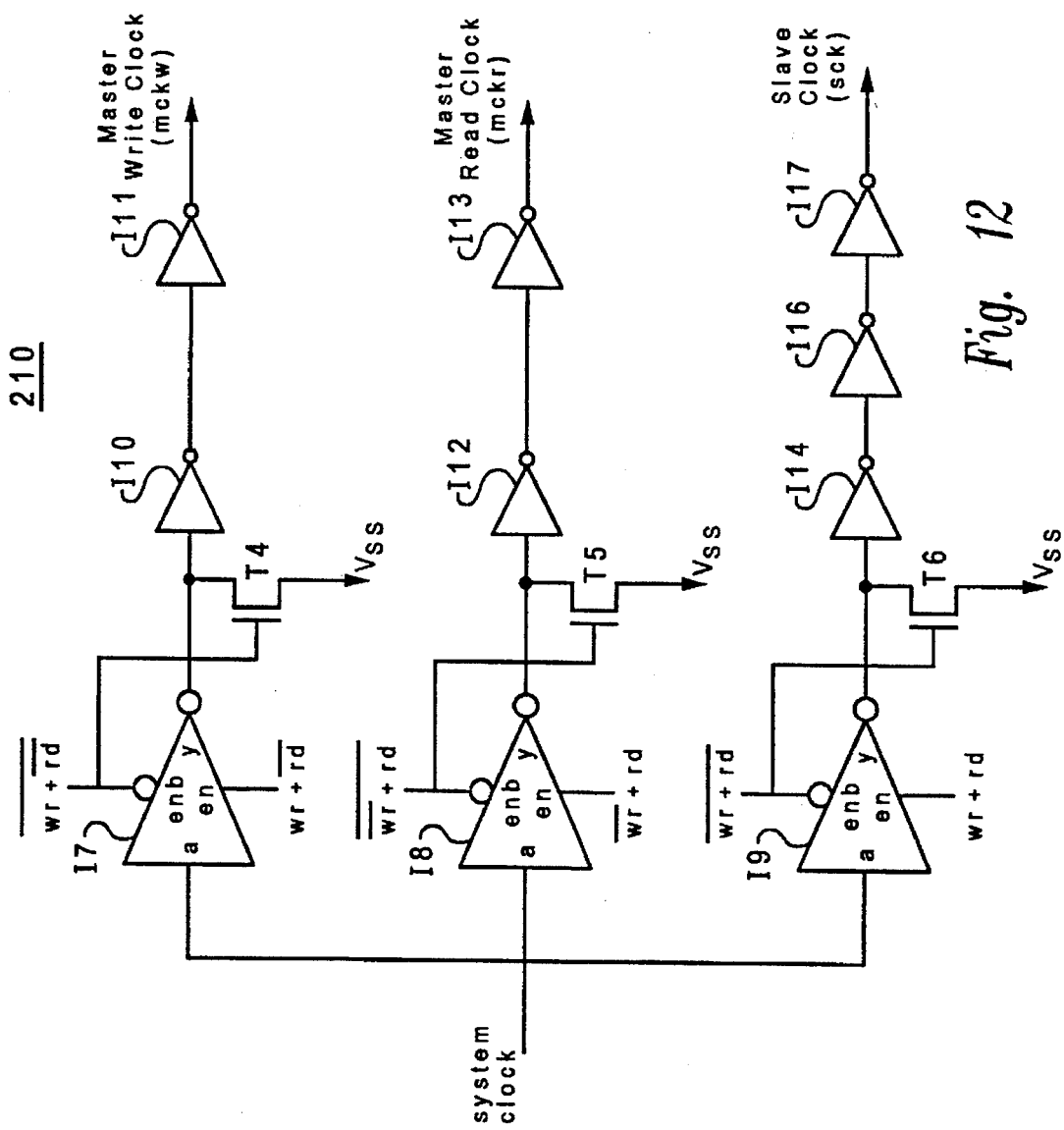
FIG. 12 is a schematic diagram of a clock generator in accordance with a preferred embodiment of the present invention.

With reference now to FIG. 12, a schematic diagram of a circuit for generating the master write clock mckw, the master read clock mckr, and the slave clock sck are depicted in accordance with a preferred embodiment of the present invention. Circuit 210 includes three-state inverters I7, I8, and I9, these inverters receive the system clock as an input. Three-state inverter I7 includes two enable inputs enb and en connected to signals $\overline{\text{wr-rd}}$ and wr·rd. Transistor T4 also has a source/drain connected to a lower power supply voltage $V_{SS}$ and a gate connected to signal $\overline{\text{wr-rd}}$. The output of three-state inverter I7 is connected to a source drain of T4 and an input of inverter I10. The output of inverter I10 is connected to inverter I11, which has an output that produces the master write clock mckw.

Three-state inverter I8 includes inputs enb and en for enable signals $\overline{\text{wr·rd}}$ and $\overline{\text{wr·rd}}$. The output of three-state inverter I8 is connected to the source/drain of transistor T5 and to an input of inverter I12. Transistor T5 is an n channel MOSFET having a source/drain connected to a lower power supply voltage $V_{SS}$ and a gate connected to signal $\overline{\text{wr·rd}}$. The output of inverter I12 is connected to the inverter I13, which has an output that generates master read clock mckw.

Three-state inverter I9 contains enable inputs enb and en for signals $\overline{\text{wr+rd}}$ and wr+rd. This inverter has an output connected to a source/drain of transistor T6 and an input to inverter I14. Transistor T6 also has a source/drain connected to a lower power supply voltage $V_{SS}$ and a gate connected to signal $\overline{\text{wr+rd}}$. The output of inverter I14 is connected to the input of inverter I15, which has an output connected to the input of inverter I16. Inverter I16 has an output that produces the slave clock sck.

With reference now to FIG. 12, a schematic diagram of a three-state inverter 220, such as three-state inverters I7, I8, or I9, is depicted in accordance with a preferred embodiment of the present invention. Three-state inverter 220 includes transistors T7-T10. Transistors T7 and T8 are p channel MOSFETS while transistors T9 and T10 are n channel MOSFETS. Transistor T7 has a source connected to an upper power supply voltage $V_{DD}$ while transistor T9 has a drain connected to lower power supply voltage $V_{SS}$. The transistors T7-T10 are connected in series with an output between the drain of transistor T8 and the source to transistor T9. The enable signals are connected to the gates of transistors T7 and T9, which provide enable inputs enb and en, respectively. An input into three-state inverter 220 is connected to the gates of transistors of T8 and T9.

The present invention provides an advantage eliminating the need for additional circuits, logic, or clocks to add a scan capability by existing register read paths and adding a scan input to the first bit to the bottom register of the LIFO register stack and a scan output at the last bit of the top register in the LIFO register stack. Additionally, the output of each bit location in the bottom register is sent to the next bit location of the top register such that data moved from the bottom register to the top register is shifted to the right by one bit. Thus, the present invention provides the advantage of providing a scan path that does not require additional devices, logic or clocks. The design of the present invention also provides a simpler scan path that may be executed faster than by the conventional scan techniques.

While the invention has been particularly shown and described with reference to a preferred embodiment, it will be understood by those skilled in the art that various changes in form and detail may be made therein without departing from the spirit and scope of the invention.

What is claimed is:

1. A last-in-first-out register stack, comprising:

a plurality of registers arranged in a stack, each register having a plurality of bit locations, wherein the plurality of registers includes a top register and a bottom register;

each bit location in a register within the plurality of registers and located between the top register and the bottom register being in communication with a corresponding bit location in an adjacent register located above the register and a corresponding bit location in an adjacent register located below the register;

each bit location in the top register being in communication with an offset bit location in the bottom register except for the last bit location in the top register, the last bit location in the top register having a scan output; and a first bit location in the bottom register having an input for receiving data.

2. The last-in-first-out register stack of claim 1, wherein the plurality of registers is four.

3. The last-in-first-out register stack of claim 1, wherein the plurality of registers is ten.

4. The last-in-first-out register stack of claim 1, wherein the plurality of bit locations is 32 bit locations.

5. The last-in-first-out register stack of claim 1, wherein the plurality of bit locations is 64.

6. The last-in-first-out register stack of claim 1, wherein a bit location in a register located between the top register and the bottom register includes a multiplexer having a first input for receiving data from a corresponding bit location located in an adjacent register above the register and a second input for receiving data from a corresponding bit location located in an adjacent register below the register and a latch having an input connected to an output of the multiplexer and an output connected to an input of the corresponding bit location located in the adjacent register above the register and to an input of the corresponding bit location located in the adjacent register located below the register.

7. The last-in-first-out register stack of claim 6, wherein a bit location located in the top register includes a multiplexer having a first input for receiving data and a second input for receiving data from a corresponding bit location located in an adjacent register below the top register and a latch having an input connected to an output of the multiplexer and having an output connected an offset bit location in the bottom register; and wherein the offset bit location located in the bottom register includes a multiplexer having a first input connected to the output of the latch in the bit location in the top register and a second input for receiving data from a corresponding bit location located in an adjacent register above the bottom register; and a latch having an input connected to an output of the multiplexer in the offset bit location and having an output connected a corresponding bit location in an adjacent register located above the bottom register.

8. The last-in-first-out register stack of claim 1, wherein a bit location in a register located between the top register and the bottom register includes a latch having a first input for receiving data from a corresponding bit location located in an adjacent register above the register and a second input for receiving data from a corresponding bit location located in an adjacent register below the register and an output connected to a first input of the corresponding bit location located in the adjacent register above the register and to a first input of the corresponding bit location located in the adjacent register located below the register.

9. The last-in-first-out register stack of claim 8, wherein a bit location located in the top register includes a latch having an input for receiving data and a second input for receiving data from a corresponding bit location from a corresponding bit location located in an adjacent register below the top register and an output connected to offset bit location in the bottom register; and wherein the offset bit location located in the bottom register includes a latch having a first input connected to output of the latch in the bit location in the top register and a second input for receiving data from a corresponding bit location located in an adjacent register above the bottom register and an output connected to a corresponding bit location in an adjacent register located above the bottom register.

10. A method in a last-in-first-out register stack for scanning data, wherein the LIFO register stack includes a plurality of registers arranged in a stack, each register having a plurality of bit locations wherein the plurality of bit registers includes a top register and a bottom register, each bit location within a register within the plurality of registers and located between the top register and the bottom register being in communication with the corresponding bit location in an adjacent register located above the register and a corresponding bit location in an adjacent register located below the register, the method comprising:

connecting a first bit location in the bottom register to an input for a bit of data;

connecting each bit location in the top register except for a last bit location in the top register to an offset bit location in the bottom register;

inputing a bit of data into the first bit location in the bottom register;

moving the bit of data from the first bit location in the bottom register into corresponding bit locations located above the bottom register until the bit of data reaches a corresponding bit location in the top register; and moving the bit of data in the bit location located in the top register to a bit location in the bottom register, wherein the bit of data is shifted by one bit location to the right from the bit location in the top register.

\* \* \* \* \*